(12) United States Patent
Lange et al.

(10) Patent No.: US 8,884,343 B2
(45) Date of Patent: Nov. 11, 2014

(54) SYSTEM IN PACKAGE AND METHOD FOR MANUFACTURING THE SAME

(71) Applicant: Texas Instruments Deutschland, Freising (DE)

(72) Inventors: Bernhard Lange, Freising (DE); Juergen Neuhaeusler, Bad Aibling (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/770,237

(22) Filed: Feb. 19, 2013

(65) Prior Publication Data

US 2013/0221526 A1 Aug. 29, 2013

(30) Foreign Application Priority Data

Feb. 24, 2012 (EP) .................................... 12156909

(51) Int. Cl.
*H01L 29/76* (2006.01)
*H01L 29/94* (2006.01)
(Continued)

(52) U.S. Cl.
CPC ............... *H01L 21/50* (2013.01); *H01L 23/051* (2013.01); *H01L 24/32* (2013.01); *H01L 24/29* (2013.01); *H01L 2224/05655* (2013.01); *H01L 23/48* (2013.01); *H01L 2224/04105* (2013.01); *H01L 2224/83455* (2013.01); *H01L 2224/32145* (2013.01); *H01L 2224/32225* (2013.01); *H01L 2224/29339* (2013.01); *H01L 25/072* (2013.01); *H01L 25/071* (2013.01); *H01L 2224/73267* (2013.01); *H01L 24/73* (2013.01); *H01L 23/5389* (2013.01); *H01L 24/83* (2013.01); *H01L 2224/06181* (2013.01); *H01L 2224/8384* (2013.01); *H01L 2224/0346* (2013.01); *H01L 24/33* (2013.01); *H01L 2224/33181* (2013.01); *H01L 2224/83192* (2013.01); *H01L 2224/04026* (2013.01); *H01L 2924/19105* (2013.01); *H01L 2924/13091* (2013.01); *H01L 24/24* (2013.01); *H01L 2224/24227* (2013.01)
USPC ........... 257/288; 257/678; 257/735; 257/762; 257/769; 257/744; 257/E21.006; 257/E21.051; 257/E21.077; 257/E21.165; 257/E21.296; 257/E21.421; 257/E21.499; 257/E21.508; 257/E21.509; 257/E21.511; 438/106; 438/197

(58) Field of Classification Search
USPC .......... 438/106, 197; 257/288, 735, 744, 769, 257/678, 686, 762, 766, E21.006, E21.007, 257/E21.051, E21.077, E21.165, E21.296, 257/E21.421, E21.499, E21.508, E21.509, 257/E21.511
See application file for complete search history.

(56) References Cited

U.S. PATENT DOCUMENTS 7,898,083 B2 * 3/2011 Castro .......................... 257/754
8,120,158 B2 * 2/2012 Ewe et al. ..................... 257/686
(Continued)

FOREIGN PATENT DOCUMENTS

JP 2001044606 A 2/2001
KR 1020110111232 A 10/2011

*Primary Examiner* — David Nhu

(74) *Attorney, Agent, or Firm* — Steven A. Shaw; Frederick J. Telecky, Jr.

(57) ABSTRACT

A system in package and a method for manufacturing the same is provided. The system in package comprises a laminate body having a substrate arranged inside a laminate body. A semiconductor die is embedded in the laminate body and the semiconductor is bonded to contact pads of the substrate by help of a sintered bonding layer, which is made from a sinter paste. Lamination of the substrate and further layers providing the laminate body and sintering of the sinter paste may be performed in a single and common curing step.

15 Claims, 10 Drawing Sheets

(51) Int. Cl.
*H01L 31/062* (2012.01)
*H01L 31/113* (2006.01)
*H01L 31/119* (2006.01)
*H01L 23/48* (2006.01)
*H01L 23/538* (2006.01)
*H01L 21/50* (2006.01)
*H01L 23/051* (2006.01)
*H01L 23/00* (2006.01)
*H01L 25/07* (2006.01)

(56) References Cited

U.S. PATENT DOCUMENTS

| | | | |
|---|---|---|---|
| 8,350,382 B2 * | 1/2013 | Furgut et al. | 257/724 |
| 8,530,360 B2 * | 9/2013 | Castro | 438/780 |
| 2008/0116569 A1 * | 5/2008 | Huang et al. | 257/712 |
| 2011/0108971 A1 * | 5/2011 | Ewe et al. | 257/686 |
| 2011/0143502 A1 * | 6/2011 | Castro | 438/127 |
| 2011/0193217 A1 | 8/2011 | Meyer-Berg | |
| 2013/0221526 A1 * | 8/2013 | Lange et al. | 257/750 |

* cited by examiner

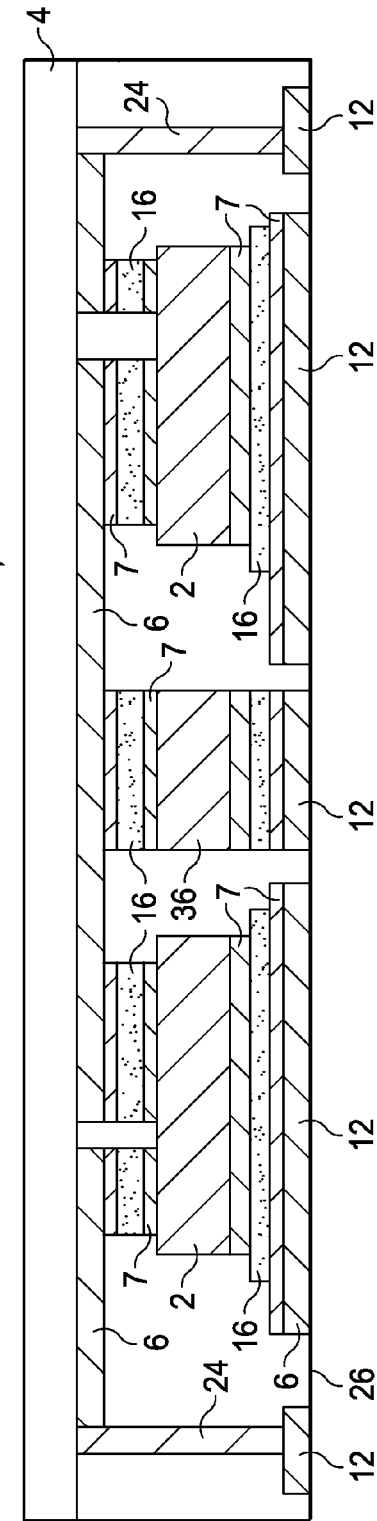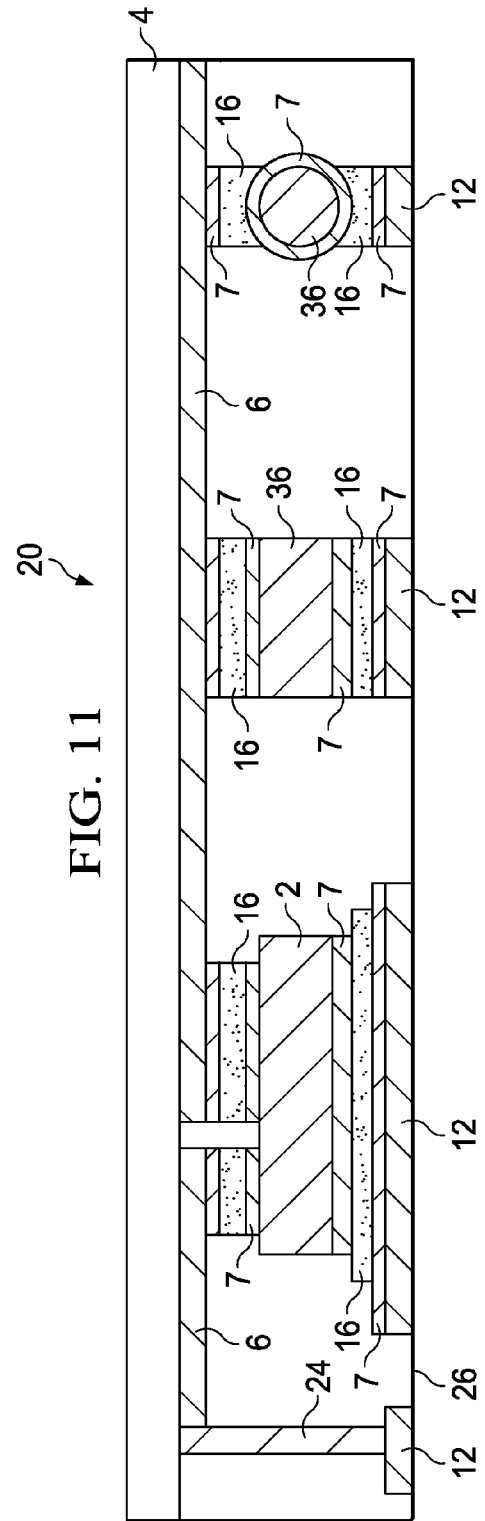

US 8,884,343 B2

SYSTEM IN PACKAGE AND METHOD FOR MANUFACTURING THE SAME

CROSS REFERENCE TO RELATED APPLICATIONS

This application claims priority to European Application 12156909.0 filed Feb. 24, 2012. Said application herein incorporated by reference for all purposes.

FIELD

Embodiments of the invention relate to a system in package (SIP) comprising a laminate body having a substrate and a semiconductor die arranged in the laminate body. Further, other embodiments relate to a method for manufacturing the system in package.

BACKGROUND

Increasing demands for miniaturized electronic systems at reduced cost require reliable and cost-effective semiconductor packages with small form factors. For portable electronic products, smaller packing and smaller subsystem packing has become paramount. Size reductions do no longer focus on packing surface area only, the package thickness and weight has to be reduced, also.

One approach to fulfill the increasing customer demands is a so called "system in package" which was developed to address the growing challenges faced in many applications such as computing and telecommunication. A system in package, for example the MicroSIP (μSIP) package from Texas Instruments Incorporated (Dallas Tex.) incorporates a semiconductor die, a controller, as examples in a laminate substrate. Furthermore, active and/or passive electronic components, such as inductor(s), are incorporated in the system in package by placing them on top of an upper surface of a laminate substrate or body.

However, bonding of the semiconductor die is still lead frame based, which means that the die is bonded with the use of copper clips to the lead frame which fends out to the package bottom side. The copper clips require space within the package. Thus, there may be room for improvements with respect to the speed of the assembly process.

SUMMARY

According to an aspect of the invention, a system in package comprising a laminate body comprising a substrate which is arranged inside the laminate body is provided. Preferably, the substrate is pre-pressed. A semiconductor die is embedded in the laminate body and at least one contact area of the semiconductor die is bonded to a contact pad of the substrate by help of a sintered bonding layer which is made from a sinter paste.

The system in package according to aspects of the invention may be manufactured in a combined pressing and sintering process. In other words, both, heat and pressure is applied to the stack forming the laminate body. A pressing step is typically known from the manufacture of printed circuit boards and is typically carried out at process temperatures in a range around 200° C. Advantageously and according to an aspect of the invention, it could be determined that the process parameters of such a pressing step are suitable for performing a sintering process, too. As a result, a combined pressing and sintering step is provided. Sintering of the sinter paste takes place and the sintered bonding layer is provided within the same process step which is applied for lamination of the stack.

According to another aspect of the invention, a method for manufacturing a system in package is provided. A sinter paste is applied to contact pads of a substrate and/or to contact areas of a semiconductor die. Preferably, the application of the sinter paste is performed by paste printing and sinter paste is applied to either the contact areas of a semiconductor die or the contact pads of a substrate. The contact areas of the semiconductor die are placed on the contact pads of the substrate. In other words, the contact areas of the semiconductor die and the contact pads of the substrate are brought in register with each other. The substrate together with the placed semiconductor die and further layers forming a laminate body of the system in package are stacked. Finally, a combined pressing and sintering step is performed on the stack. During this combined pressing and sintering step, the substrate and the further layers of the stack are laminated so as to provide the laminate body. Further, during the combined pressing and sintering step, sintering of the sinter paste is performed so as to provide an electrical connection between the contact pads of the substrate and the contact areas of the semiconductor die. In other words, lamination of the stack and electrical contacting is performed in a common and single process step.

During the combined pressing and sintering step, said stack may be exposed to heat and pressure as it is typically known for the manufacture of printed circuit boards. Further, the method may comprise a step of pre-pressing the substrate and the semiconductor die will be arranged on this pre-pressed substrate before pressing and sintering the stack. Further, a partial pre-sintering of the sinter paste may be performed before the final pressing and sintering step.

BRIEF DESCRIPTION OF DRAWINGS

Further aspects and characteristics of the invention ensue from the following description of the preferred embodiments of the invention with reference to the accompanying drawings, wherein FIGS. 10 and 11 are illustrative of further simplified systems in package comprising a semiconductor die and a metal block providing a high current connection.

DETAILED DESCRIPTION

Figure 1:
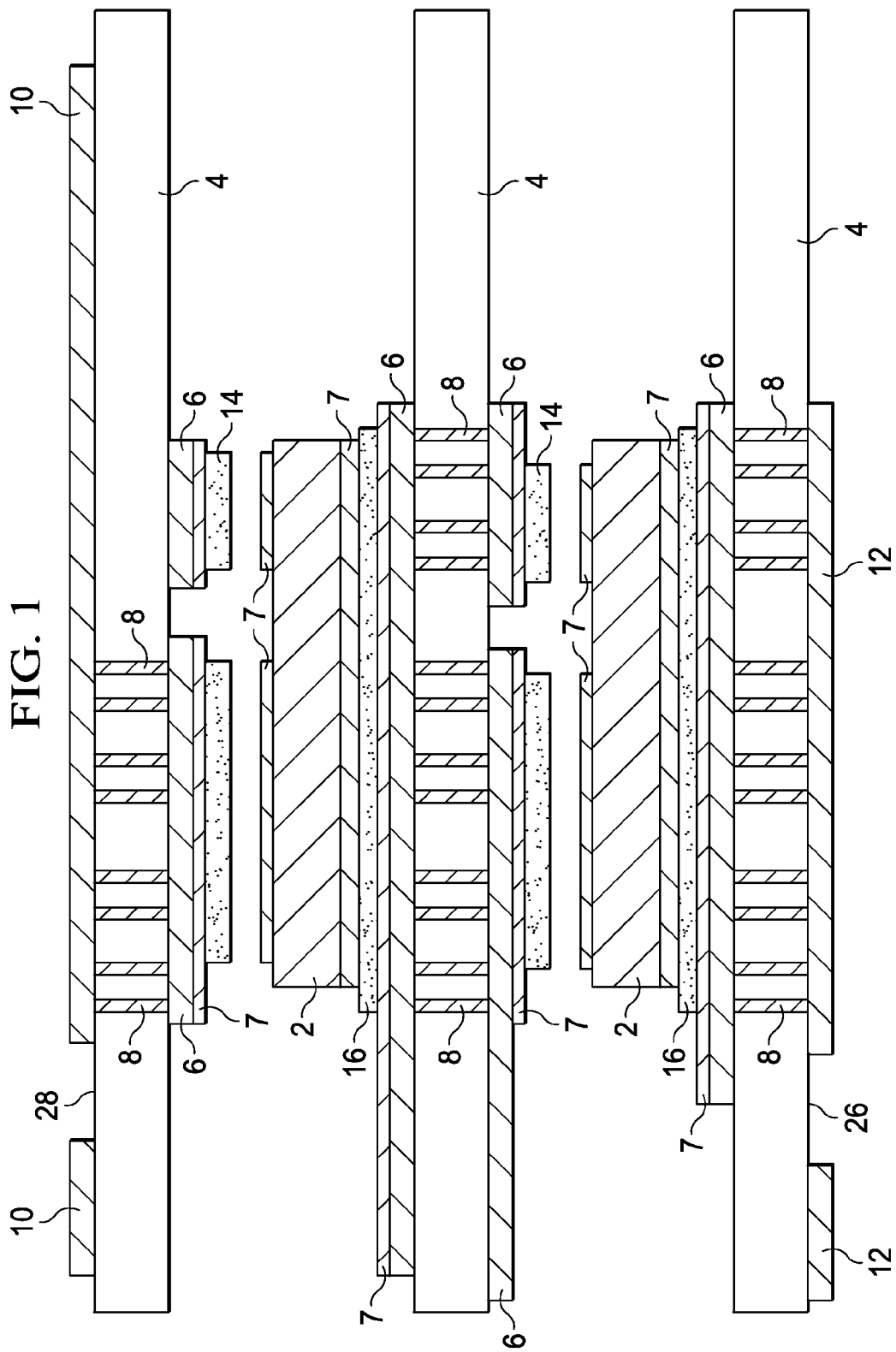
FIG. 1 is illustrative of a simplified stack for manufacturing a system in package, the stack is shown after placement of semiconductor dies and before sintering and pressing the stack-up.

FIG. 1 is illustrative of a simplified stack for manufacturing a system in package. The stack is shown after placement of semiconductor dies 2 onto respective substrates 4 and before sintering and pressing the stack. Preferably, the substrates 4 are pre-pressed and further preferably, they are made from a printed circuit board material such as a fibre reinforced resin. Contact pads 6 of the substrates 4 are preferably made from copper and have a plating 7 which is made from a noble metal. The material of the plating 7 is preferably more noble than copper when considered in a galvanic series. Preferably, NiAu or NiAg is applied for the plating 7. Advantageously, for example a NiAu plating 7 prevents the Cu contact pads 6 from oxidation during the sinter process. Further, there is a plating 7 which is arranged in contact areas of the semiconductor dies 2. Both, a font side and a backside of the semiconductor dies 2 may be provided with a NiAu plating 7. In other words, each contact area or contact pad 6 which is designated to be coupled or contacted by help of a sintered connection is provided with a noble metal plating 7 to prevent oxidation of the sintered electrical contact.

Electrically conductive vias 8 (for clarity reasons, only some of said vias 8 are given reference numerals) project through the substrate 4. For the substrate 4 which is arranged in the middle of the stack, the vias 8 are for electrically coupling a respective contact pad 6 which is arranged on a first surface of the substrate 4 with a further contact pad 6 which is arranged on an opposite surface of the substrate 4. Preferably, the electrically conductive vias 8 are copper filled drilling holes. At the upper substrate 4, the vias 8 electrically couple a contact pad 6 which is arranged at an inner surface of the substrate 4 with an upper contact pad 10 which is arranged at an upper surface 28. Something similar applies to the lower substrate 4, the vias 8 are for coupling the contact pad 6 which is arranged at an inner surface with a lower contact pad 12 which is arranged at a lower surface 26 of the stack. Further active and/or passive components may be arranged at the upper surface 28 and may be coupled to the upper contact pads 12. The lower surface 26 of the stack typically faces a printed circuit board if the system in package is mounted thereto. An electric coupling of the system in package to the printed circuit board may be provided via the lower contact pads 12.

In the embodiment of FIG. 1, the contact pads 6 of the substrates 4, more precisely the plating 7 of the lower contact pads 6 of the upper and middle substrate 4 are provided with sinter paste 14 which is preferably applied by sinter paste printing. Preferably, the sinter paste 14 is made from a metal or a metal alloy which is more noble than Cu. Again, this is considered in a galvanic series and a preferable material is a Ag-based sinter paste 14. For manufacture of a system in package, the sinter paste 14 is applied to either one or both of the contact areas of the semiconductor dies 2 and the contact pads 6 of the substrates 4. Preferably, and according to the embodiment in FIG. 1, sinter paste 14 is printed to the contact pads 6 of the substrates 4. Subsequently, the semiconductor dies 2 are placed on top of the sinter paste 14 on the respective contact pads 6 of the substrates 4 which means that the contact areas of the semiconductor dies 2 are brought in register with the contact pads 6 of the substrates 4.

In the embodiment of FIG. 1, a backside of the semiconductor dies 2 has been provided with sinter paste and a pre-sintering step has been performed so as to attach the backside of the semiconductor dies 2 to the substrates 4. In the pre-sintering step, the sinter paste becomes a sintered bonding layer 16 which is arranged between the backside of the dies 2 and the upper contact pads 6 of the substrates 4. By way of an example only, the semiconductor dies 2 are power MOSFETs and the depicted stack-up is for providing a stacked power-FET configuration.

Figure 2:
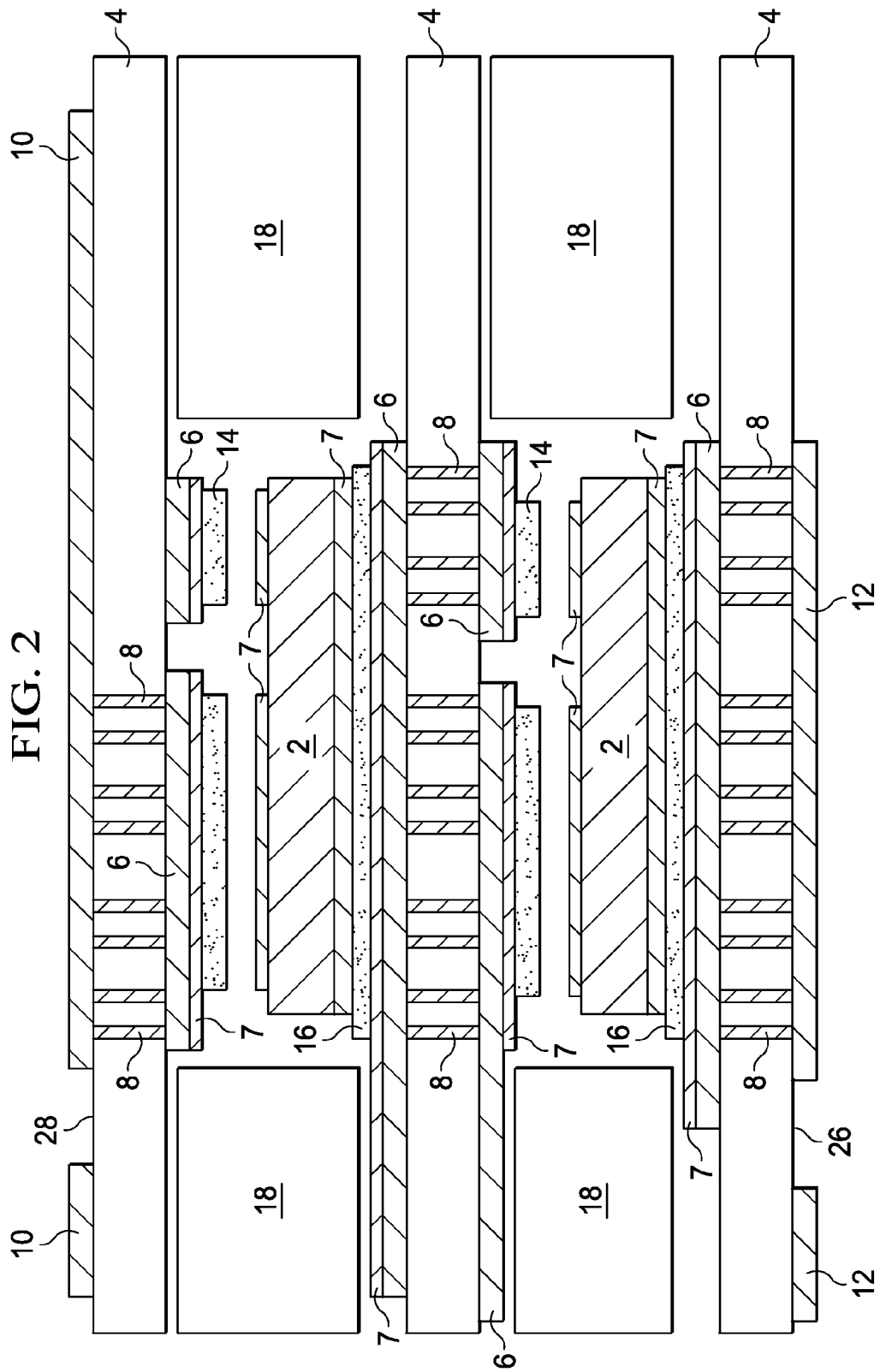
FIG. 2 is illustrative of the stack of FIG. 1, wherein a filling material is inserted between subsequent substrates.

FIG. 2 is illustrative of the stack-up known from FIG. 1, wherein a filling material 18 is inserted between adjacent substrate layers 4. The filling material 18 is added to the stack during the stack-up step and preferably, the filling material 18 is pre-cut to accommodate the semiconductor dies 2. The filling material 18 may further accommodate additional active and/or passive components (not shown) which may be integrated in the system in package. The filling material 18 is for filling voids in the stack-up during the subsequent pressing and sintering step.

In the combined pressing and sintering step, the stack-up of FIG. 2 is exposed to heat and pressure, wherein parameters for performing this step may be in a range for temperature and pressure which is typically known from the manufacture of a printed circuit board. For example, a curing temperature of about 200° C. may be applied. During said combined pressing and sintering step, lamination of the substrates 4 and the filling material 18 is performed so as to provide a laminate body of the system in package. At a same time, sintering of the sinter paste 14 takes place so as to couple or bond the contact pads 6 of the substrates 4 and the connecting areas of the semiconductor dies 2. Advantageously, the system in package may be manufactured in a combined process step which means lamination and sintering is performed in a single and common process step. This simplifies the manufacturing process of the system in package. It is further advantageous that the semiconductor dies 2 are bonded directly to a respective conductive path or contact pad 6 of the substrate 4. There is no need for a lead frame. The abandonment of the lead frame and the required bond wire bonding process between the semiconductor die 2 and the lead frame is advantageous with respect to manufacturing cost and will further speed up the manufacturing process.

Figure 3:
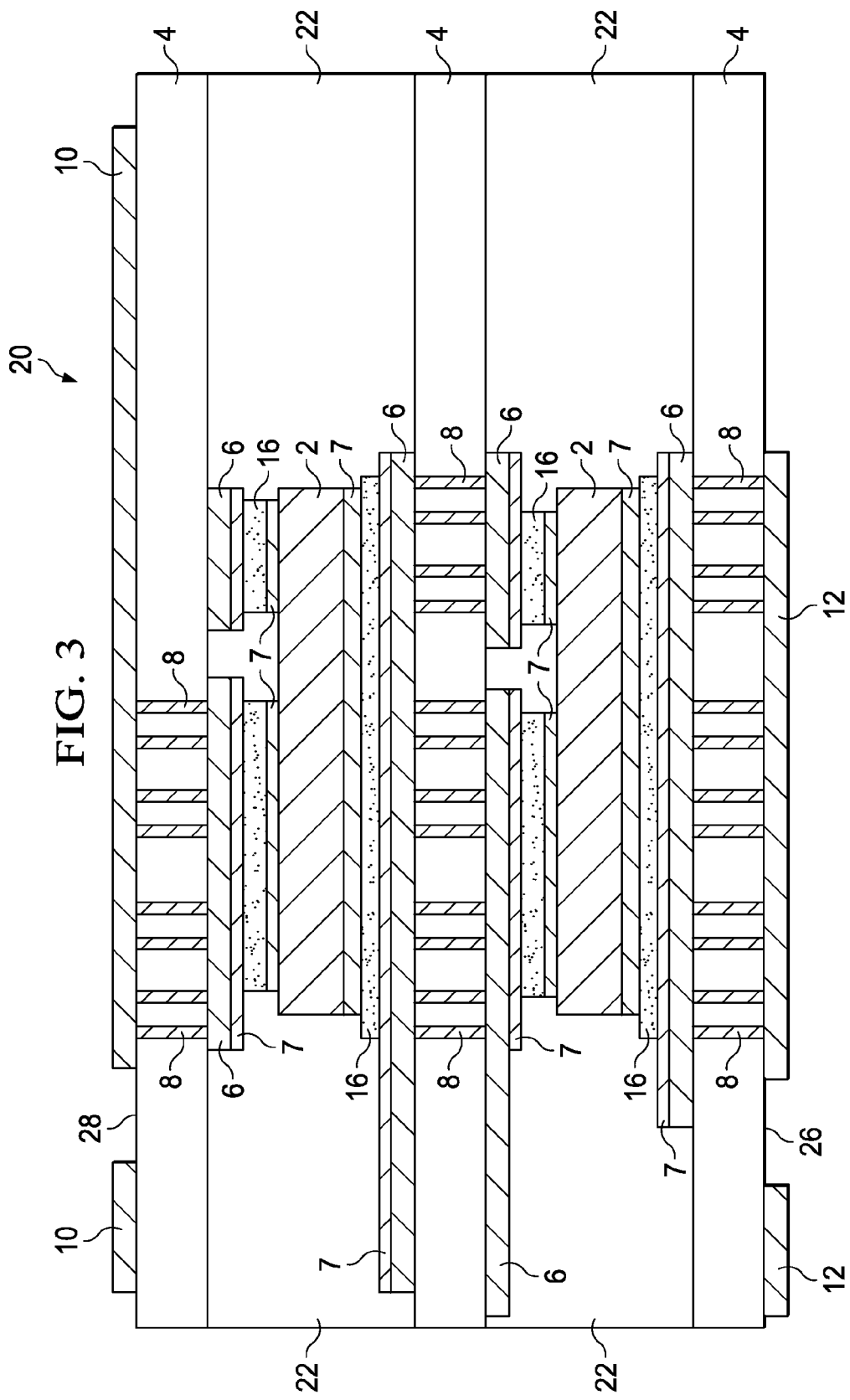
FIG. 3 is illustrative of a simplified system in package which is manufactured by curing the stack-up known from FIGS. 1 and 2.

FIG. 3 is illustrative of a simplified system in package 20 comprising a laminate body which is substantially manufactured from the substrates 4, cured filling material 22 and the embedded semiconductor dies 2. Within the combined pressing and sintering step, the sinter paste pads 16 which have been previously applied or printed on the lower contact pads 6 of the upper and center substrate 4 become a sintered bonding layer 16. The contact areas of the semiconductor dies 2 are coupled to the contact pads 6 of the substrate 4 by help of the sintered bonding layer 16.

In the system in package 20 of FIG. 3, the semiconductor dies 2 are coupled to the upper contact pads 10 and to the lower contact pads 12 via electrically conductive vias 8. Further active and/or passive electronic components may be embedded on and coupled to the upper contact pads 10. For example, for provision of a stacked power MOSFET configuration, these further active and/or passive electronic components (not shown) may be an inductor or a capacitor so as to provide a highly integrated power converter having a small form factor and a small footprint. The lower contact pads 12 of the system in package 2 may be coupled to a printed circuit board of an electronic device by application of an arbitrary conventional bonding or soldering technology.

Figure 4:
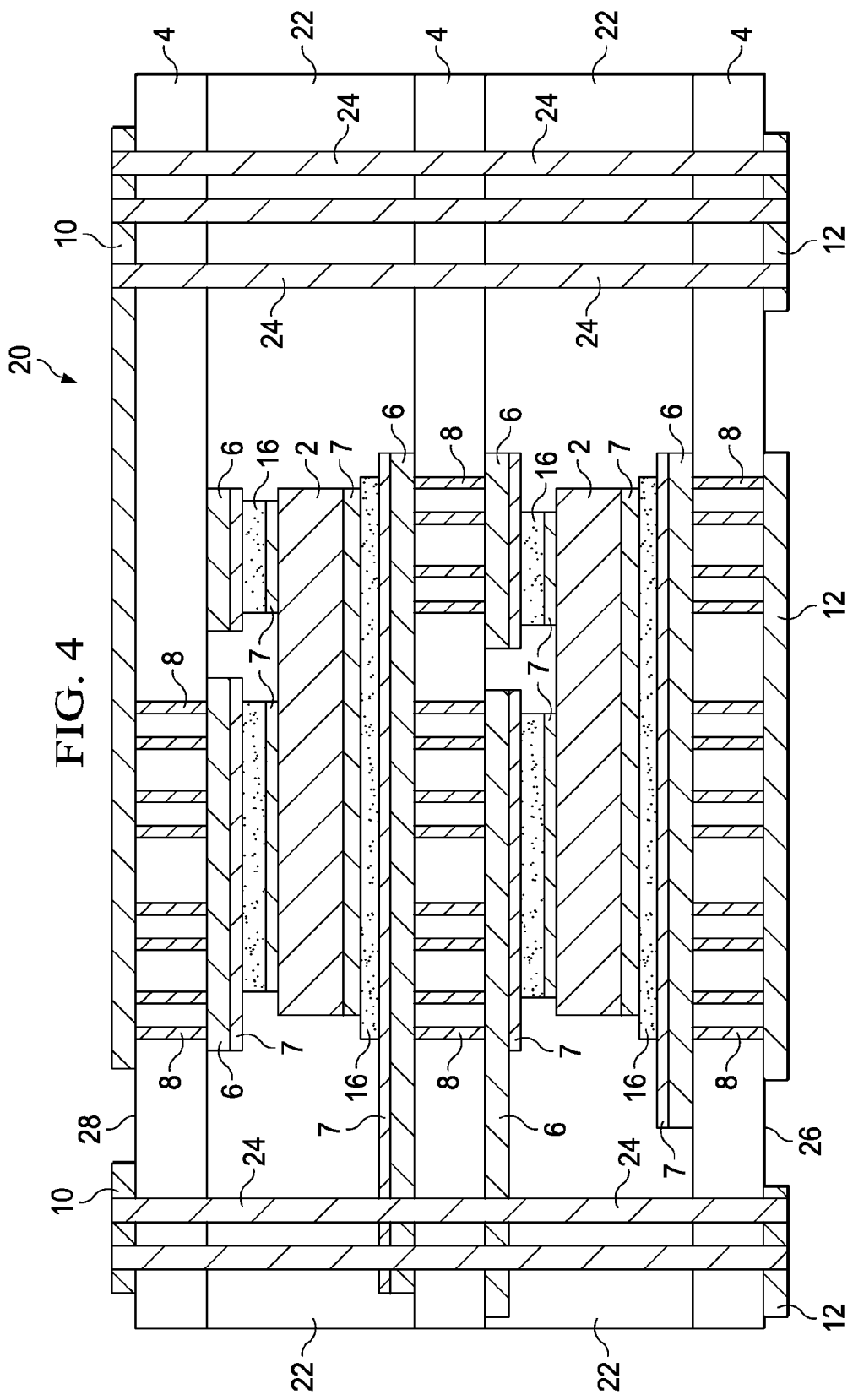
FIG. 4 is illustrative of the simplified system in package of FIG. 3, wherein vias are inserted so as to provide a connection between an upper, middle and lower interconnection surface of the system in package.

FIG. 4 is illustrative of the system in package 20 of FIG. 3, however, vertical connections 24 which may be copper filled vias, are inserted in the system in package 20 according to the embodiment of FIG. 4. The vertical connections 24 are for coupling the upper contact pads 10 of the system in package 20 with the lower contact pads 12 and contacts pads 12 of the middle substrate 4 if required. The system in package 20 may comprise further electronic components (not shown) which are embedded in the laminate body. For example, a controller may be integrated in the system in package 20 and may be applied for controlling the power MOSFETs (i.e. the semiconductor dies 2) so as to provide a highly integrated power stage. These further active and/or passive electronic components may be coupled to the respective upper and/or lower contact pads 10, 12 of the system in package 20 by help of the vertical connections 24. Preferably, the further electronic components, for example a controller chip or a small capacitor are embedded in the second layer of the system in package 20. Consequently, on-space on the upper side 28 may be leveraged for larger electronic parts or components which are required for the module.

According to another embodiment of the invention, contact areas of a same semiconductor die 2 may be coupled via the substrates 4. In other words, a first contact area of a semiconductor die 2 may be coupled to a contact pad 6 of a substrate 4 and a further contact pad 6 of said substrate 4 is coupled to a further contact area of said semiconductor die 2. According to an aspect of the invention, the further contact area may a contact area of a further semiconductor die 2. The latter embodiment allows coupling two or more semiconductor dies 2 via the substrate 4. The electrical connection between the respective contact areas and the contact pads 6 may be provided by a sintered bonding layer 16 which is made from sinter paste 14. Advantageously, this aspect removes the need for complex inter die wire bonding. Complex routing on a PCB to which the respective system in package is assembled may be simplified.

Thermal coupling of the semiconductor dies 2, in particular if power MOSFETs are applied as semiconductor dies 2, may be an important issue. Accordingly, it may be advantageous to provide a system in package 20 having no substrate layer 4 adjacent to an upper and/or lower surface 28, 26 of the system in package 20.

Figure 5:
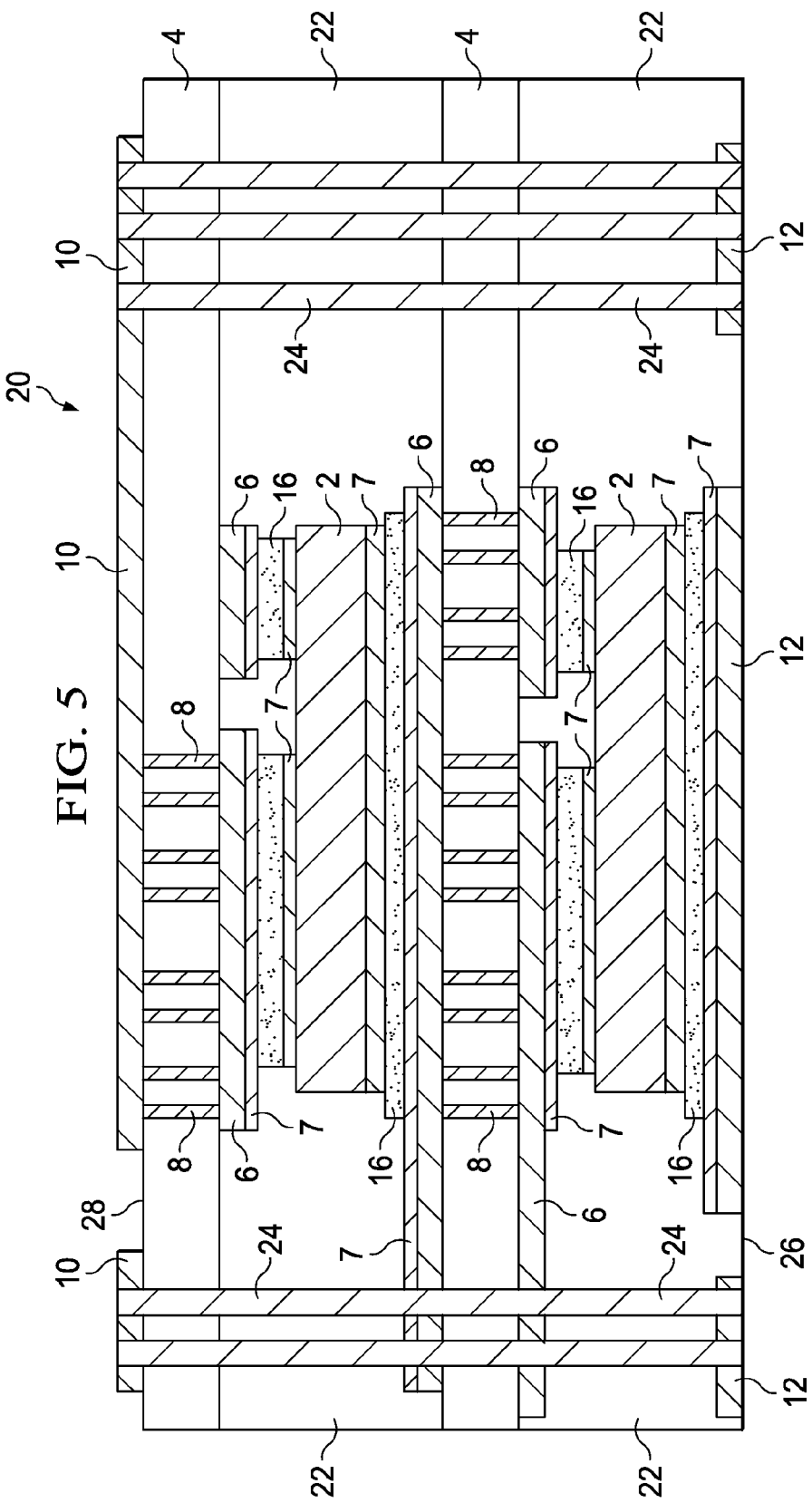
FIG. 5 is illustrative of a further simplified system in package having no lower substrate.

FIG. 5 is illustrative of another simplified system in package 20 according to an embodiment of the invention, wherein there is no substrate 4 adjacent to the lower surface 26. Accordingly, especially for the lower semiconductor die 2, there is very efficient heat transfer to a printed circuit board which may be arranged adjacent to the lower surface 26 of the system in package 20. In principle, the configuration of the system in package 20 in FIG. 5 is known from FIG. 4 despite of the fact there is no substrate 4 adjacent to the lower surface 26. Therefore, the configuration of the system in package 20 of FIG. 5 will not be explained repeatedly.

Figure 6:
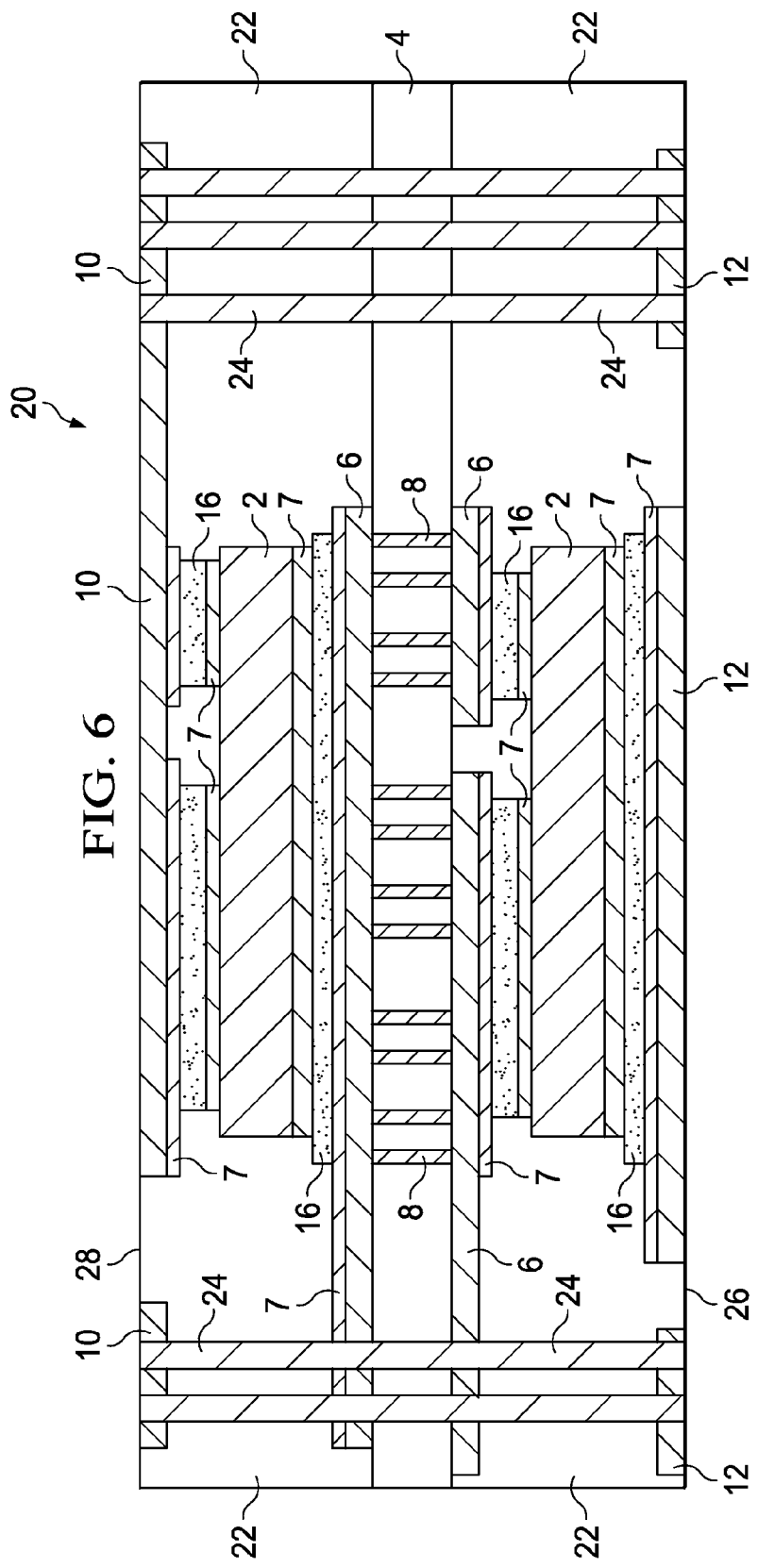
FIG. 6 is illustrative of another simplified system in package having no substrate adjacent to an upper and lower surface.

FIG. 6 is illustrative of a further simplified system in package 20 according to another embodiment of the invention. For providing efficient thermal coupling of the upper die 2 to the upper surface 28 and of the lower die 2 to the lower surface 26 of the system in package 20, it may be advantageous to dispense not only the substrate 4 which is adjacent to the lower surface 26 but to dispense the substrate 4 which is adjacent to the upper surface 28, too. Accordingly, the system in package 20 according to the embodiment in FIG. 6 comprises a single substrate 4 in the center of the system in package 20 only. There is very efficient heat dissipation for the upper and lower semiconductor die 2. The configuration of the system in package 20 according to the embodiment in FIG. 6 is in principle known from FIG. 5 despite of the fact the substrate 4 which is adjacent to the upper surface 28 is omitted. Therefore, explanations with respect to the configuration of the system in package 20 are not repeated.

Figure 7:
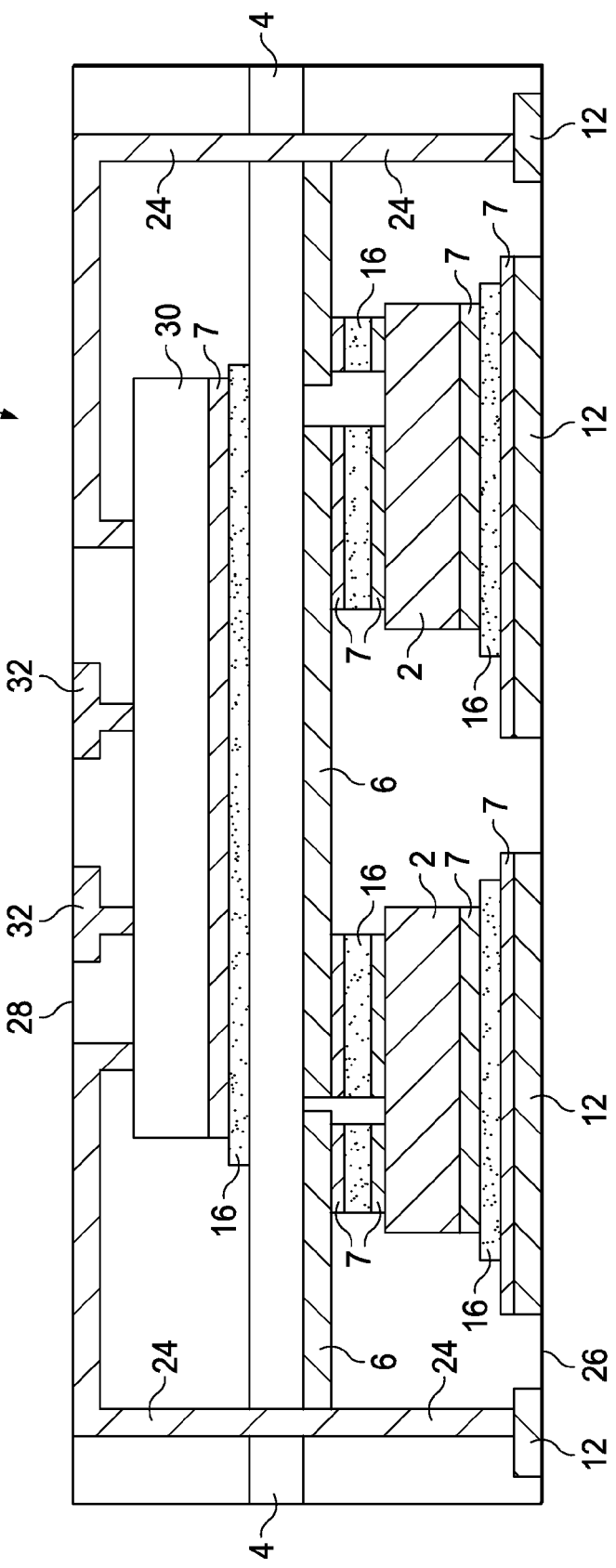
FIG. 7 is illustrative of a further simplified system in package comprising two power FETs placed side by side and a controller stacked on top of the FETs.

FIG. 7 is illustrative of a simplified system in package 20 according to another embodiment of the invention. The system in package 20 comprises a substrate layer 4 which is arranged in the center of the system in package 20 and which is adjacent to cured filling material 22 embedding a first and a second semiconductor die 2 which are arranged side by side in a lower layer. Further, a controller 30 is arranged in an upper layer of the system in package 20. There is no substrate layer at a lower surface 26 of the system in package 20 so as to provide efficient heat dissipation from the semiconductor dies 2, which are power MOSFETs according to the embodiment in FIG. 7, to a printed circuit board which may be adjacent to the lower side 26 of the system in package 20.

The semiconductor dies 2 are bonded to the lower contact pads 12 which are embedded in a lower surface 26 of the system in package 20 and to contact pads 6 of the substrate 4 by help of sintered bonding layers 16. Something similar applies to the controller 30 which is bonded to the substrate layer 4 by help of a sintered bonding layer 16. However, standard die attaching methods may be applied for bonding the controller 30, too. As already mentioned with respect to the embodiments in FIGS. 1 to 6, the system in package 20 according to the embodiment in FIG. 7 may be stacked up and lamination of the laminate body (mainly comprising the substrate 4 and the filling material, shown as cured filling material 22) and sintering of sinter paste pads so as to provide a bonding of the semiconductor dies 2 and the controller 30 is performed in a single and combined process step. Further contacts 32 for coupling the controller 30 may be inserted in the upper surface 28 of the system in package 20 using conventional technology. Coupling of the controller 30 to lower contact pads 12 may be provided by vertical connections 24 which may be copper filled vias and which are for coupling an upper side of the controller 30 with lower contact pads 12. An additional layer on top of the upper surface 28 can provide space and interconnections for topside arranged external components.

Figure 8:
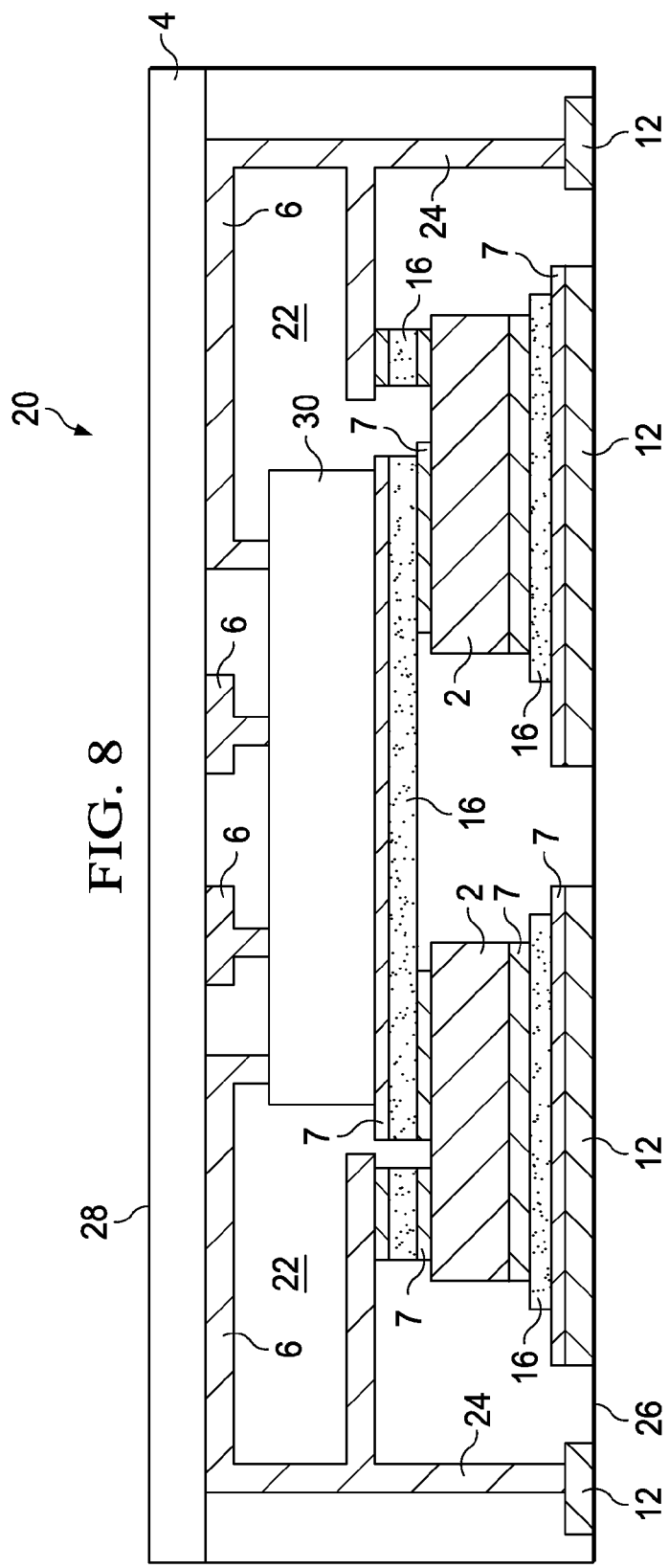
FIG. 8 is illustrative of another simplified system in package comprising two power FETs arranged side by side and a passive component placed upon an upper surface.

FIG. 8 is illustrative of a simplified system in package 20 which is configured similar to the system in package 20 according to FIG. 7. However, there is no substrate 4 arranged in the center of the stack. The substrate 4 is arranged adjacent to an upper surface 28 of the system in package 20. The controller 30 is coupled to contact pads 6 of the substrate 4 using conventional technology. Coupling of the contact pads 6 of the substrate 4 to lower contact pads 12 may be provided by vertical connections 24 which may be copper filled vias. The semiconductor dies 2 and the controller 30, again the semiconductor dies 2 may be power MOSFETs, are embedded in cured filling material 22. The semiconductor dies 2 are coupled to lower contact pads 12 by help of sintered bonding layers 16 as it is known from FIG. 7. However, the semiconductor dies 2 and the controller 30 are arranged in a die-on-die configuration which means that the dies 2 and the controller die 30 are directly stacked upon each other without a substrate in-between. Bonding of the dies 2, 30 is performed by help of a sintered bonding layer 16. A backside of the controller die 30, which is plated with a noble metal plating 7, is adjacent to the sintered bonding layer 16 which is further adjacent to the noble metal plating 7 of the semiconductor dies 2.

Figure 9:
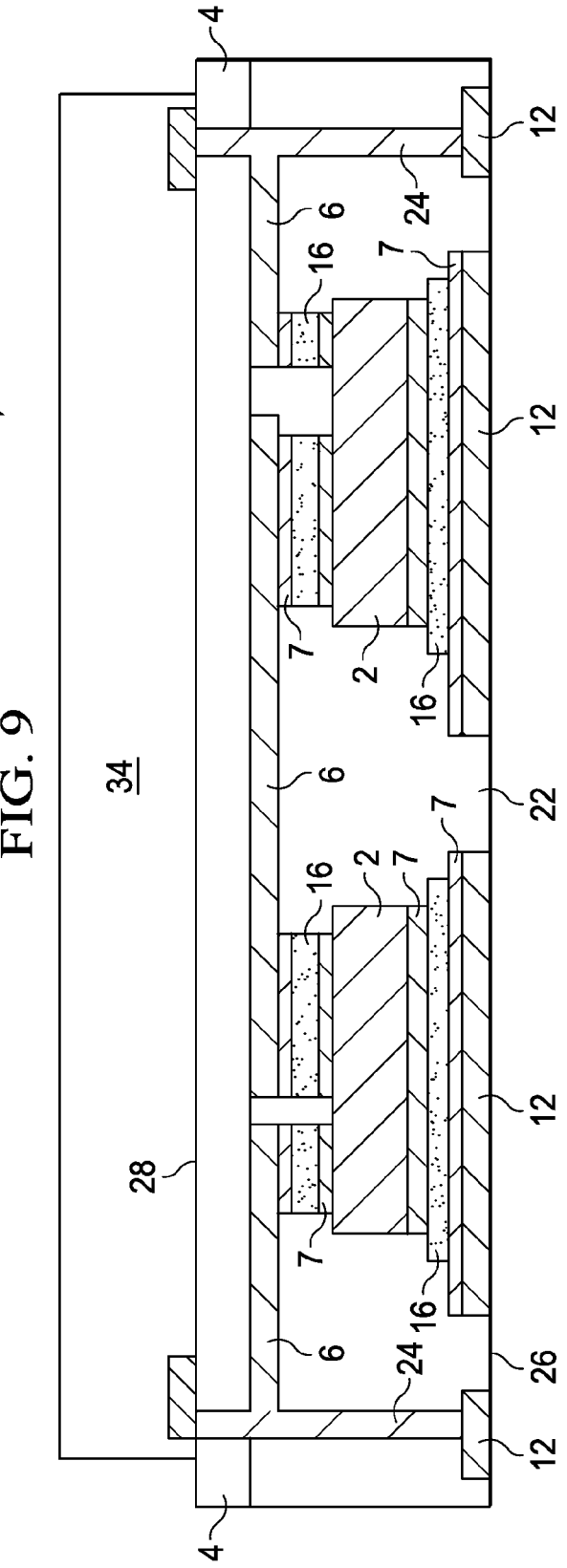
FIG. 9 is illustrative of a simplified system in package comprising two power FETs arranged side by side and a passive component, wherein the dies are directly stacked in a die-on-die configuration.

FIG. 9 is illustrative of another simplified system in package 20 comprising two semiconductor dies 2 which may be power MOSFETs of a semiconductor half bridge configuration. The system in package 20 comprises a substrate 4 which is adjacent to an upper surface 28 of the system in package 20. The substrate 4 comprises contact pads 6 which are coupled to contact areas of the semiconductor dies 2 by help of sintered bonding layers 16. The backside of the semiconductor dies 2 is coupled to lower contact pads 12 by help of sintered bonding layers 16. Advantageously, very efficient heat dissipation from the semiconductor dies 2 to a printed circuit board which may be adjacent to the lower surface 26 of the system in package 20 may be provided. Contact areas of the semiconductor dies 2 which are arranged at an upper an active side of the semiconductor dies 2 may be further coupled to lower contact pads 12 by help of vertical connections 24 which extend though the laminate body down to the contact pads 6 of the substrate layer 4. An external heat sink (not shown) or a further active and/or passive element 34 may be attached to the upper surface 28. The further element 34 is coupled to the lower contacts 12 by help of the vertical connections 24, by way of an example only. Further, there may be an additional substrate layer (not shown) on top of the upper surface 28 which can provide space for additional active and/or passive external components.

FIG. 10 is illustrative of a simplified system in package 20 comprising two semiconductor dies 2 which may be power MOSFETs of a semiconductor half bridge configuration. Further, the system in package 20 according to the embodiment in FIG. 10 comprises a metal block 36 which serves as a high current conductive path. Further active and/or passive electronic components (not shown) may be integrated in the system in package 20. The semiconductor dies 2 are coupled to contact pads 6 of the substrate 4 and to a lower contact 12 by help of sintered bonding layers 16 which are adjacent to the respective plating 7 of the contacts 6, 12. The metal block 36 is provided with a plating 7 at an upper and lower surface, too. Preferably, a Cu-block is used as a metal block 36. To prevent oxidation of the Cu during the sinter process, there is a noble metal plating 7 at the metal block 36. Oxidation of the Cu would probably deteriorate the quality of the sintered bond but may be omitted due to the presence of the plating 7. The metal block 36 serves as a high current connection, providing a conductive path from the upper side of the semiconductor die 2 via the contact pad 6 and the metal block 36 to a circuit board which may be arranged adjacent to a lower surface of the system in package 20.

Integration of the metal block 36 is in general comparable to integration of a semiconductor die 2. In other words, each semiconductor die 2 in the above referenced embodiments may be replaced by a suitably plated metal block 26 if necessary or desired. Integration and placement of a metal block 36 in the system in package 2 may be driven by a need for a high current connection.

FIG. 11 is illustrative of another simplified system in package 20 which is comparable to the system in package 20 according to FIG. 10. A single semiconductor die 2 is shown for clarity reasons only. However, the system in package in FIG. 11 may be configured similar to the embodiment in FIG. 10, which means that the system in package may comprise two semiconductor dies 2 arranged in a half-bridge configuration. In FIG. 11, a vertical connection 24 at the left side in FIG. 11 is provided by a filled via. However, a vertical connection may be provided by a metal ball 36, which is depicted on the right side of the system in package 20. The metal ball 36 comprises a noble metal plating 7 and is sintered via sintered bonding layers 16 to a contact pad 6 on the one hand and to a lower contact pad 12 on the other hand. Embedding the metal ball 36 may be similar to integration of the metal block 36 which is shown in the center of the system in package 20.

Although the invention has been described hereinabove with reference to specific embodiments, it is not limited to these embodiments and no doubt further alternatives will occur to the skilled person that lie within the scope of the invention as claimed.

The invention claimed is:

1. A system in package comprising:
a laminate body;
a substrate arranged inside the laminate body;
at least one contact pad on the substrate; and
a semiconductor die embedded in the laminate body, wherein at least one contact area of the semiconductor die is bonded to the at least one contact pad of the substrate via a sintered bonding layer, wherein the contact area of the semiconductor die is made from or plated with a metal or a metal alloy which is more noble than copper when considered in a galvanic series.

2. A system in package comprising:
a laminate body;
a substrate arranged inside the laminate body;
at least one contact pad on the substrate; and
a semiconductor die embedded in the laminate body, wherein at least one contact area of the semiconductor die is bonded to the at least one contact pad of the substrate via a sintered bonding layer, wherein the contact pad of the substrate is made from or plated with a metal or a metal alloy which is more noble than copper when considered in a galvanic series.

3. The system in package according to claim 1, wherein the contact area of the semiconductor die have a copper basis and a metal coating, which is arranged on the copper basis, the metal coating.

4. The system in package according to claim 1, wherein contact pad of the substrate have a copper basis and a metal coating, which is arranged on the copper basis, the metal coating.

5. The system in package according to claim 3, wherein the metal coating comprising silver.

6. The system in package according to claim 3, wherein the metal coating comprising gold.

7. The system in package according to claim 4, wherein the metal coating comprising silver.

8. The system in package according to claim 4, wherein the metal coating comprising gold.

9. A system in package comprising:
a laminate body;
a substrate arranged inside the laminate body;
at least one contact pad on the substrate; and
a semiconductor die embedded in the laminate body, wherein at least one contact area of the semiconductor die is bonded to the at least one contact pad of the substrate via a sintered bonding layer, wherein the sintered bonding layer is made from a sinter paste comprising a metal or metal alloy which is more noble than copper when considered in a galvanic series.

10. A system in package comprising:
a laminate body;
a substrate arranged inside the laminate body;
at least one contact pad on the substrate; and
a semiconductor die embedded in the laminate body, wherein at least one contact area of the semiconductor die is bonded to the at least one contact pad of the substrate via a sintered bonding layer, wherein the semiconductor die is coupled to upper and/or lower contact pads of the package which are arranged on an upper or lower surface of the laminate body, wherein no substrate is arranged adjacent to the upper and/or lower surface of the laminate body.

11. A system in package comprising:
a laminate body;
a substrate arranged inside the laminate body;
at least one contact pad on the substrate; and
a semiconductor die embedded in the laminate body, wherein at least one contact area of the semiconductor die is bonded to the at least one contact pad of the substrate via a sintered bonding layer, wherein a plurality of semiconductor dies is embedded in the laminate body and wherein contact areas of the plurality of dies are bonded to each other by help of a sintered bonding layer which is made from a sinter paste and wherein the plurality of semiconductor dies is directly stacked in a die-on-die configuration without a substrate being arranged between the dies.

12. A system in package comprising:
a laminate body;
a substrate inside the laminate body;
at least one contact pad on the substrate;
a semiconductor die embedded in the laminate body, wherein at least one contact area of the semiconductor die is bonded to the at least one contact pad of the substrate via a sintered bonding layer;
a plurality of semiconductor dies on the substrate, wherein a first semiconductor die and a second semiconductor die are arranged on opposite surfaces of said substrate so as to form a stacked semiconductor configuration;
a second substrate arranged opposite to the first substrate with respect to the first or second semiconductor die; and
a third substrate is arranged opposite to the second substrate with respect to the first substrate so as to form a package having the second and the third substrate arranged on an upper and a lower surface, respectively, and so as to provide a symmetrical stacked package with respect to the first substrate.

13. The system in package according to claim 12, further comprising a metal block of highly conductive material, the metal block having a coating which is made from a metal or a metal alloy which is more noble than copper when considered in a galvanic series.

14. The system in package according to claim 13, wherein the metal block is a copper block and the coating comprises silver and/or gold.

15. A method of manufacturing a system in package, the method comprising:
embedding a first substrate inside a laminate body;
applying sinter paste to a plurality of contact pads of the first substrate and/or a plurality of contact areas of a semiconductor die;
placing the contact areas of the first semiconductor die on the contact pads of the substrate;
stacking the first substrate and the placed semiconductor die together with further layers of forming the laminate body of the system in package, wherein the further layers comprising:
at least a second semiconductor die on an opposite surface of the first substrate so as to form a stacked semiconductor configuration;
a second substrate arranged opposite to the first substrate with respect to the first or second semiconductor die;
a third substrate arranged opposite to the second substrate with respect to the first substrate so as to form a package having the second and the third substrate arranged on an upper and a lower surface, respectively, and so as to provide a symmetrical stacked package with respect to the first substrate; and
performing a combined pressing and sintering on said stack so as to laminate the first substrate and the further layers to provide the laminate body and to perform sintering of the sinter paste to provide an electrical connection between the contact pads of the substrates and the contact areas of the semiconductor dies, wherein lamination and electrical contacting is provided in said combined pressing and sintering step.

* * * * *